(12) United States Patent
Kim

(10) Patent No.: US 7,442,640 B2
(45) Date of Patent: Oct. 28, 2008

(54) SEMICONDUCTOR DEVICE MANUFACTURING METHODS

(75) Inventor: San Hong Kim, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 429 days.

(21) Appl. No.: 11/270,310

(22) Filed: Nov. 9, 2005

(65) Prior Publication Data

US 2006/0125050 A1   Jun. 15, 2006

(30) Foreign Application Priority Data

Nov. 9, 2004   (KR) ...................... 10-2004-0090863

(51) Int. Cl.
*H01L 21/44* (2006.01)
(52) U.S. Cl. .................. 438/659; 438/301; 438/510; 257/E21.17; 257/E21.006; 257/E21.231; 257/E21.248; 257/E21.278; 257/E21.622
(58) Field of Classification Search ............... 438/659, 438/301, 510, 194, 257, 289, 290, 513, 657, 438/663, 680, 721, 723, 755
See application file for complete search history.

(56) References Cited

U.S. PATENT DOCUMENTS

| | | | | | |
|---|---|---|---|---|---|
| 5,618,740 A | * | 4/1997 | Huang | ......................... | 438/224 |
| 5,672,527 A | * | 9/1997 | Lee | ............................. | 438/275 |
| 5,780,350 A | * | 7/1998 | Kapoor | ....................... | 438/305 |
| 5,897,348 A | * | 4/1999 | Wu | ............................. | 438/200 |
| 5,998,274 A | * | 12/1999 | Akram et al. | ............... | 438/306 |
| 6,359,314 B1 | * | 3/2002 | Randazzo | ................... | 257/355 |
| 6,544,849 B2 | * | 4/2003 | Hsu et al. | .................. | 438/275 |

* cited by examiner

*Primary Examiner*—David Nhu
(74) *Attorney, Agent, or Firm*—Andrew D. Fortney

(57) ABSTRACT

Methods of manufacturing a semiconductor device including a high-voltage device region and a low-voltage device region are provided. An illustrated method includes forming, on a substrate, a gate pattern for a high-voltage device and a low-voltage device; implanting ions into opposite sides of the gate pattern, to form a lightly doped drain structure while implanting ions into a portion of the high-voltage device region under the same conditions as the low-voltage device region to form an electrostatic discharge protecting device region; forming a spacer at the side surface of the gate pattern; forming a source region and a drain source at field regions disposed at the opposite sides of the gate pattern, respectively; and forming a metal layer on the front surface of the substrate including the gate pattern.

17 Claims, 3 Drawing Sheets

US 7,442,640 B2

SEMICONDUCTOR DEVICE MANUFACTURING METHODS

FIELD OF THE DISCLOSURE

The present disclosure relates to semiconductor devices, and more particularly, to methods of manufacturing a semiconductor device simultaneously embodying a low-voltage device and a high-voltage device that are protected from static electricity.

BACKGROUND

A semiconductor manufacturing process enables simultaneous inclusion of low-voltage and high-voltage devices in a semiconductor device. Generally, the low-voltage device is used as a high-speed and high-performance device, and the high-voltage device is used for input and output. As such a semiconductor device is miniaturized for large capacity and high integration, it becomes necessary to protect the semiconductor device from electrostatic discharges. To this end, an electrostatic discharge protection device should be manufactured together with the low-voltage and high-voltage devices.

However, when the electrostatic discharge protection device is separately formed, an additional ion implantation process using an additional mask is required. These additions increase manufacturing costs. Furthermore, the electrostatic discharge protection device may cause a capacitance increase at the junction and may lead to higher leakage currents, which degrades the reliability of the semiconductor device.

Figure 1:
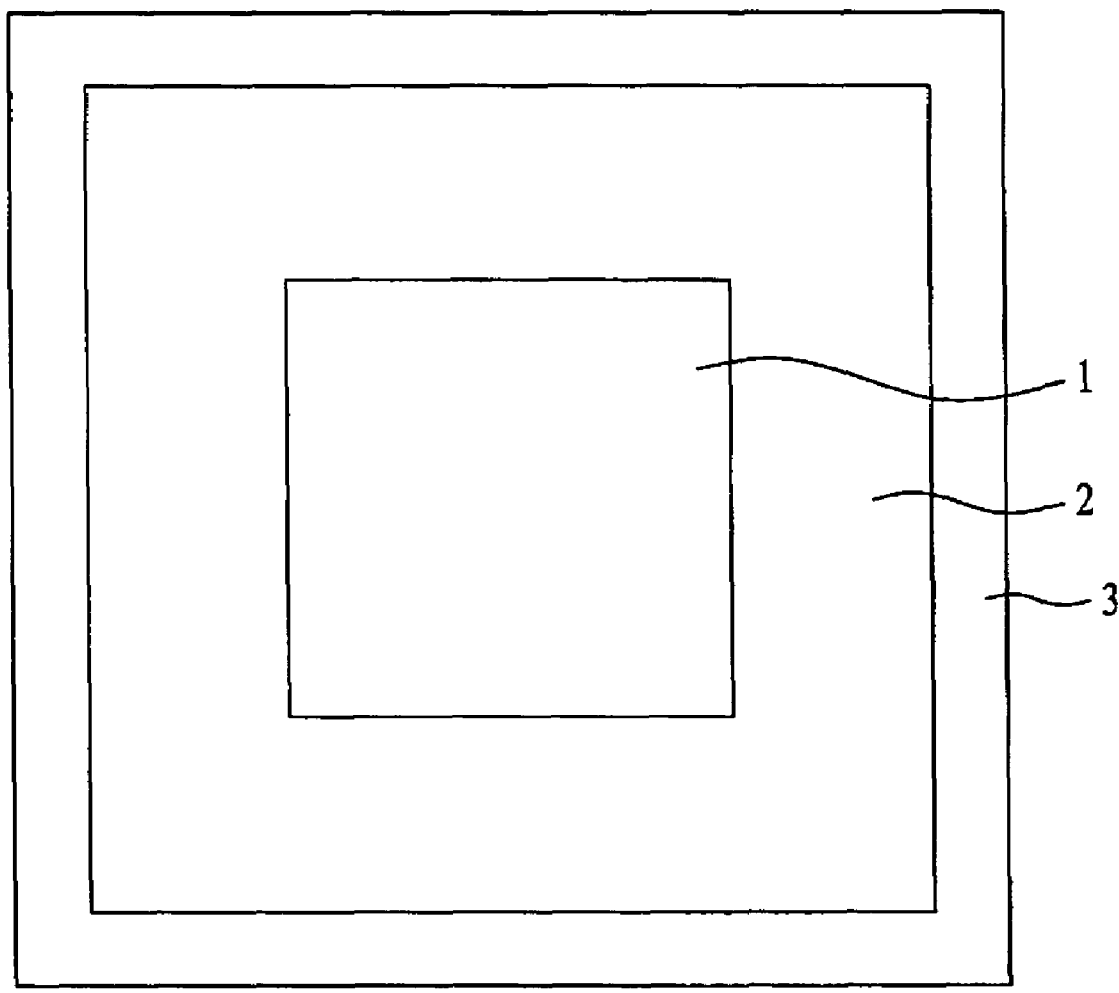
FIG. 1 is a schematic illustration of the formation of a lightly doped drain at a low-voltage device region, a high-voltage device region, and an electrostatic discharge protecting device region of an example semiconductor device constructed in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Figure 2:
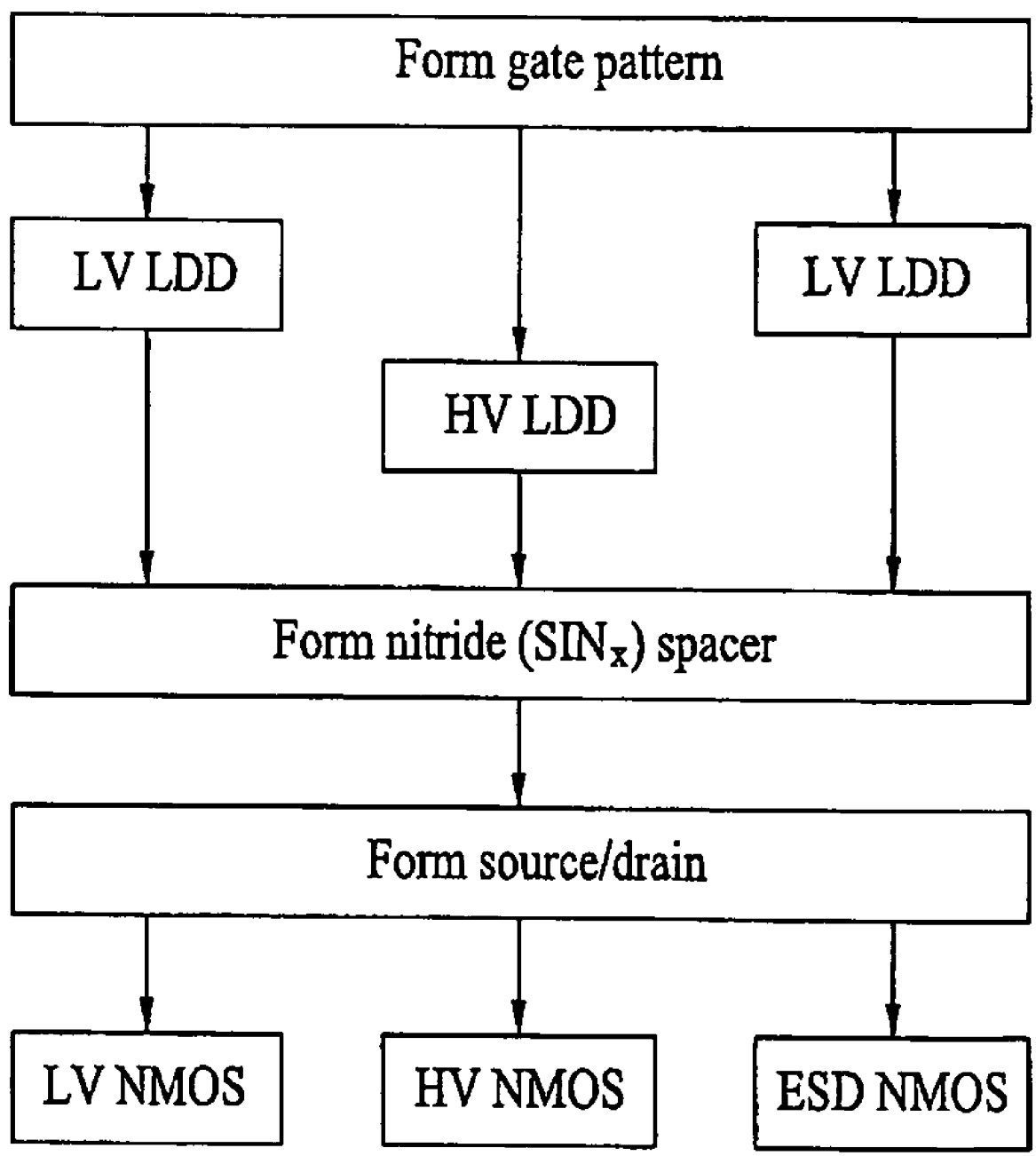
FIG. 2 is a flowchart illustrating an example method of manufacturing a semiconductor device performed in accordance with the teachings of the present invention.

Referring to FIG. 1, an example semiconductor device constructed in accordance with the teachings of the present invention includes a low-voltage (LV) device region 1, a high-voltage (HV) device region 2, and an electrostatic discharge protecting device region 3 formed over a portion of the high-voltage device region. Devices (not shown) are respectively formed at the low-voltage device region 1, the high-voltage device region 2, and the electrostatic discharge protecting device region 3. FIG. 2 illustrates an example method of forming a gate pattern for the devices.

Referring to FIG. 2, a device separating film is formed at field regions of a first conductive semiconductor substrate, (e.g., a P-type semiconductor substrate), to accomplish electrical insulation between the field regions of the semiconductor substrate. The device separating film may be formed by a shallow-trench isolation process or by local oxidation of silicon.

Next, a gate insulation film comprising silicon dioxide ($SiO_2$) is stacked on the field regions of the semiconductor substrate using a thermal oxidation process or a low pressure chemical vapor deposition process. Preferably, the gate insulation film is formed to a thickness of approximately 1,000 Å, although the thickness of the gate insulation film may be changed depending upon the characteristics of the devices.

Subsequently, a polycrystalline silicon layer, (for example, a P-type doped polycrystalline silicon layer), is stacked on the gate insulation film. In this example, the polycrystalline silicon layer is formed to a thickness of approximately 2,000 Å to 3,000 Å. Thereafter, the polycrystalline silicon layer is patterned by a photo etching process to form a gate pattern.

Subsequently, a lightly doped drain (LDD) structure is formed at a portion of the high-voltage device region 2, under the same ion implantation conditions as the low-voltage device region 1, to form the electrostatic discharge protecting device region 3. Preferably, a lightly doped drain (LDD) is simultaneously formed at the electrostatic discharge protecting device region 3 and the low-voltage device region 1 using a single mask.

As shown in FIG. 2, only masks for the high-voltage device region and the low-voltage device region are used when forming the lightly doped drain (LDD) in the example semiconductor device manufacturing process of FIG. 2. Therefore, no additional mask is required for the electrostatic discharge protection.

One of the masks, which will be referred to in this detailed description as a first mask, is provided to implant ions into the high-voltage device region 2. An opening is only formed at a region of the first mask corresponding to the high-voltage device region 2 such that a predetermined number of ions are implanted through the opening.

The other mask, which will be referred to in this detailed description as a second mask, is provided to simultaneously implant ions into the low-voltage device region 1 and the electrostatic discharge protecting device region 3. An opening is formed at a region of the second mask corresponding to the low-voltage device region 1 and the electrostatic discharge protecting device region 3 such that a predetermined number of ions are implanted through the opening.

An n-type dopant (n−), such as phosphorus (P), or a p-type dopant, such as boron (B), is lightly implanted through the masks.

In the illustrated example, ions are implanted to a concentration of $1 \times 10^{13}$ to $7 \times 10^{13}$ atoms/cm$^2$ into the high-voltage device region 2. High-voltage devices are used for input or output. Therefore, a reliability problem, such as hot carrier injection, may occur when ions are successively implanted. Consequently, ions are preferably doped with a small amount of implantation.

On the other hand, ions are implanted into the low-voltage device region 1 and the electrostatic discharge protecting device region 3 to a concentration of at least $5 \times 10^{14}$ atoms/ cm², preferably 5×10¹⁴ to 5×10¹⁵ atoms/cm². Low-voltage devices are generally used as high-speed and high-performance devices. Therefore, relatively high lightly doped drain (LDD) ion implantation is employed.

Due to the difference between such lightly doped drain (LDD) ion implantation conditions, the low-voltage device has a low junction breakdown voltage of approximately 5-7V while the high-voltage device has a high junction breakdown voltage of approximately 8-10V. As a result, the high-voltage device region having a small amount of lightly doped drain ion implantation has a higher electrostatic discharge trigger voltage than the low-voltage device region. Therefore, the high-voltage device region has a higher electrostatic discharge clamp voltage than the low-voltage device region.

Consequently, when the electrostatic discharge protecting device region is formed over a portion of the high-voltage device region under the lightly doped drain (LDD) ion implantation conditions applied to the low-voltage device region, it is possible to embody a semiconductor device having an improved electrostatic discharge property without providing additional masks and, thus, without incurring additional costs.

Figure 3:
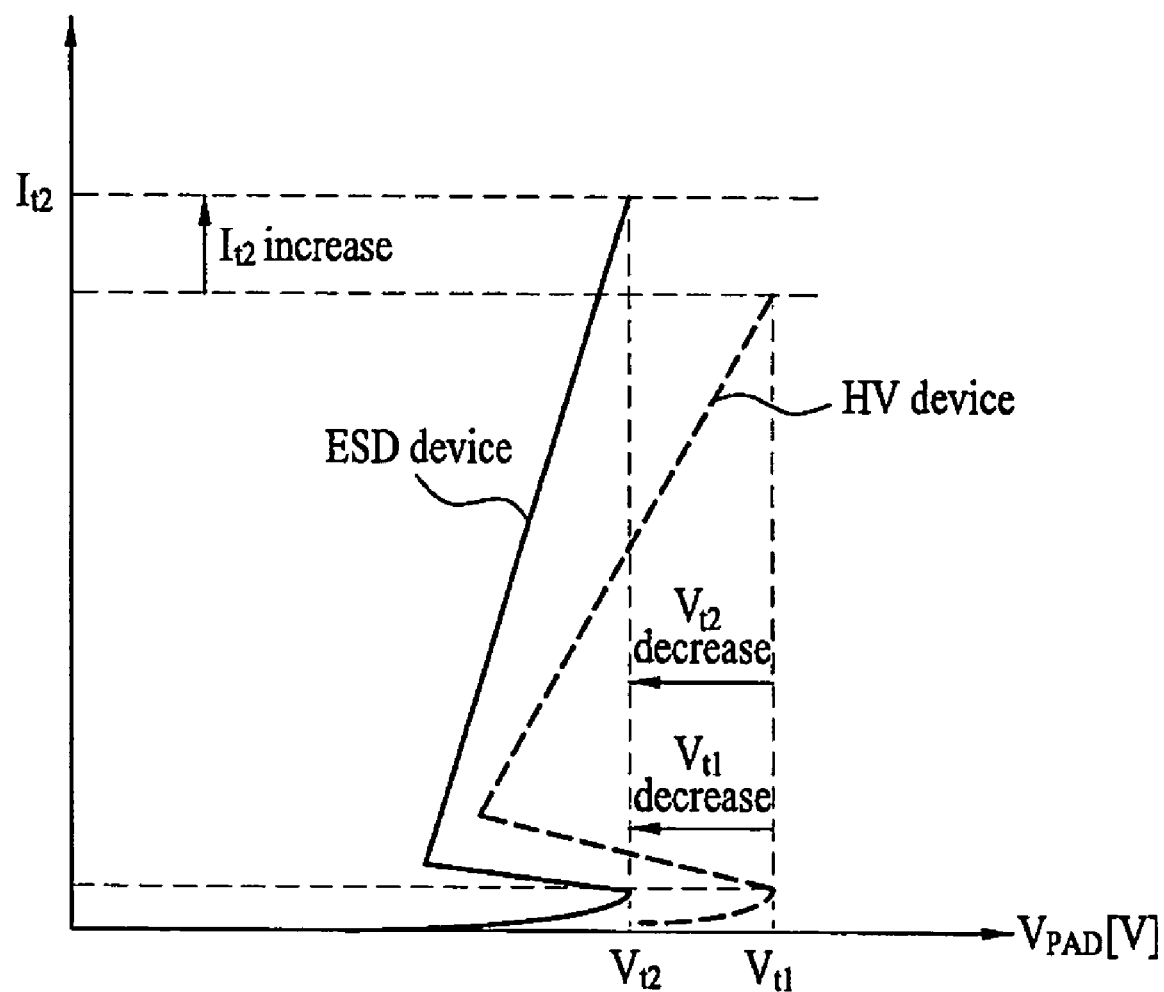
FIG. 3 is a graph of an example current-voltage characteristic of an example electrostatic discharge protecting device region of an example semiconductor device constructed in accordance with the teachings of the present invention.

It can be seen from FIG. 3 that, when a portion of the high-voltage device region is formed as the electrostatic discharge protecting device, the electrostatic discharge protecting device has a lower electrostatic discharge trigger voltage ($V_{t1}$) and a lower electrostatic discharge clamp voltage ($V_{t2}$) than the high-voltage device region. Therefore, the electrostatic discharge protecting device can protect the devices from high-voltage electrostatic discharges. Also, the electrostatic discharge protecting device has higher second breakdown current ($I_{t2}$) than the high-voltage device region, and therefore, power consumption of the electrostatic discharge protecting device is relatively low. Consequently, the electrostatic discharge protection effect is improved.

Furthermore, the electrostatic discharge protecting device manufactured as described above may be embodied as a gate-grounded metal oxide semiconductor (GGMOS) with normal circuit operation. Consequently, reliability problems, such as hot carrier injection, preferably do not occur.

As described above, a lightly doped drain (LDD) is formed at the low-voltage device region 1 and the electrostatic discharge protecting device region 3 under the same ion implantation conditions. Another lightly doped drain (LDD) is formed at the high-voltage device region 2 under ion implantation conditions different from the ion implantation conditions applied to the low-voltage device region 1 and the electrostatic discharge protecting device region 3.

Next, an oxide film and a nitride film are sequentially stacked on the field regions, and the stack is etched using a dry etching process having an anisotropic etching property. As a result, a spacer is formed at the side surface of the gate pattern.

Subsequently, a dopant, such as phosphorus (P), is heavily (n+) implanted into the field regions at opposite sides of the gate pattern to form high-concentration (n+) source and drain regions. Then, thermal processing is performed to activate the ions. Consequently, the source region and the drain region, both of which have a lightly doped drain (LDD) structure, are formed while the gate pattern is disposed between the source region and the drain region.

Thereafter, a metal layer having a low specific resistance, such as nickel (Ni), is formed at the front surface of the semiconductor substrate, which includes the gate pattern, the source region, the drain region, and the spacer.

Subsequently, rapid thermal processing or common thermal processing is performed to thermally process the metal layer under an inert gas atmosphere, such as helium (He) or argon (Ar). In this example, the metal layer on the gate pattern, the source region, and the drain source is changed into a silicide layer.

As apparent from the above example description, the manufactured semiconductor device is effectively protected from electrostatic discharge without the provision of additional processes. Therefore, the reliability of the resulting semiconductor device is improved.

In view of the foregoing, persons of ordinary skill in the art will appreciate that semiconductor device manufacturing methods have been disclosed that substantially obviate one or more problems due to limitations and disadvantages of the prior art.

A disclosed example semiconductor device manufacturing method is capable of protecting the resulting device from static electricity without requiring an additional process, thereby improving the reliability of the resulting semiconductor device.

A disclosed example method of manufacturing a semiconductor device which includes a high-voltage device region and a low-voltage device region, comprises forming, on a substrate, a gate pattern for a high-voltage device and a low-voltage device; implanting ions into opposite sides of the gate pattern to form a lightly doped drain (LDD) structure while implanting ions into a portion of the high-voltage device region under the same conditions as the ions are implanted into the low-voltage device region, to form an electrostatic discharge protecting device region; forming a spacer at the side surface of the gate pattern; forming a source region and a drain source at field regions disposed at the opposite sides of the gate pattern, respectively; and forming a metal layer on the front surface of the substrate including the gate pattern.

It is noted that this patent claims priority from Korean Patent Application Serial Number 10-2004-0090863, which was filed on Nov. 9, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a semiconductor device including a high-voltage device region and a low-voltage device region, the method comprising:

forming a gate pattern on the high-voltage device region and on the low-voltage device region;

forming a first lightly doped drain (LDD) structure in a first portion of the high-voltage device region on opposite sides of a first gate of the gate pattern by implanting first ions into the first portion of the high-voltage device region, wherein the first ions are implanted to a concentration of $1 \times 10^{13}$ to about $7 \times 10^{13}$ atoms/cm²;

forming a second LDD structure in a second portion of the high-voltage device region on opposite sides of a second gate of the gate pattern by implanting second ions into the second portion of the high-voltage device region and simultaneously forming a third LDD structure in a portion of the low-voltage device region on opposite sides of a third gate of the gate pattern by implanting second ions into the low-voltage device region, wherein the second ions are implanted to a concentration of $5 \times 10^{14}$ to $5 \times 10^{15}$ atoms/cm²;

forming a spacer at a side surface of the gate pattern;

forming a source region and a drain source at field regions disposed at the opposite sides of the gate pattern, respectively; and forming a metal layer on a front surface of the substrate including the gate pattern.

2. A method as defined in claim 1, wherein simultaneously forming the second and third lightly doped drain (LDD) structures comprises ion implantation using a same mask.

3. A method as defined in claim 1, wherein the second portion of the high-voltage device region is at an edge of the high-voltage device region.

4. A method as defined in claim 1, wherein an electrostatic discharge protecting device is formed in the second portion of the high-voltage device region.

5. A method as defined in claim 4, wherein simultaneously forming the second and third lightly doped drain (LDD) structures comprises ion implantation using a same mask.

6. A meted as defined in claim 4, wherein the second portion of the high-voltage device region is at an edge of the high-voltage device region.

7. A method as defined in claim 4, wherein a low-voltage device is formed in the low-voltage device region.

8. A method as defined in claim 7, wherein the low-voltage device has a breakdown voltage of approximately 5-7 V.

9. A method as defined in claim 4, wherein a high-voltage device is formed in the first portion of the high-voltage device region.

10. A method as defined in claim 9, wherein the high-voltage device has a breakdown voltage of approximately 8-10 V.

11. A method as defined in claim 9, wherein the electrostatic discharge protecting device has higher second breakdown current than the high-voltage device.

12. A method as defined in claim 1, wherein a low-voltage device is formed in the low-voltage device region.

13. A method as defined in claim 12, wherein a high-voltage device is formed in the high-voltage device region.

14. A method as defined in claim 13, wherein an electrostatic discharge protecting device is formed in the second portion of the high-voltage device region.

15. A method as defined in claim 14, wherein the electrostatic discharge protecting device has higher second breakdown current than the high-voltage device.

16. A method as defined in claim 15, wherein the high-voltage device has a breakdown voltage of approximately 8-10 V.

17. A method as defined in claim 16, wherein the low-voltage device has a breakdown voltage of approximately 5-7 V.

* * * * *